(12) United States Patent
Trivedi et al.

(10) Patent No.: US 12,482,447 B2
(45) Date of Patent: *Nov. 25, 2025

(54) AMBIENT VOLUME CONTROL IN OPEN AUDIO DEVICE

(71) Applicant: BOSE CORPORATION, Framingham, MA (US)

(72) Inventors: Mehul Trivedi, Oakland, CA (US); Vincent Lee, San Francisco, CA (US); Cory Roberts, Mendon, MA (US); James P. Mulvey, Reading, MA (US); Guy Anthony Torio, Holliston, MA (US)

(73) Assignee: Bose Corporation, Framingham, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/590,513

(22) Filed: Feb. 28, 2024

(65) Prior Publication Data

US 2024/0203394 A1 Jun. 20, 2024

Related U.S. Application Data

(63) Continuation of application No. 17/654,856, filed on Mar. 15, 2022, now Pat. No. 11,955,107, which is a continuation of application No. 16/179,592, filed on Nov. 2, 2018, now Pat. No. 11,295,718.

(51) Int. Cl.
*H03G 3/32* (2006.01)
*G06F 1/16* (2006.01)
*G10K 11/178* (2006.01)
*H03G 5/16* (2006.01)

(52) U.S. Cl.
CPC ........ *G10K 11/17827* (2018.01); *G06F 1/163* (2013.01); *H03G 3/32* (2013.01); *H03G 5/165* (2013.01); *G10K 2210/1081* (2013.01)

(58) Field of Classification Search
CPC ....... G10K 11/17827; G10K 11/17821; G10K 11/1781; G10K 11/178; G10K 11/175; G10K 11/16; G10K 11/00; G10K 2210/1081; G06F 1/163; G06F 1/16; G06F 1/00; H03G 3/32; H03G 3/30; H03G 3/20; H03G 3/00; H03G 5/165; H03G 5/16;

(Continued)

(56) References Cited

U.S. PATENT DOCUMENTS 7,983,426 B2 *   7/2011   Schuler ................ G01H 3/14
                                                          381/56
8,964,998 B1 *   2/2015   McClain ................ H03G 3/32
                                                          381/106

(Continued)

*Primary Examiner* — Mohamed Charioui
(74) *Attorney, Agent, or Firm* — Patterson + Sheridan, LLP

(57) ABSTRACT

Methods and apparatus are provided for automatically adjusting, by an audio device, the SPL of its audio output. As described herein, the SPL is adjusted based on detected ambient noise. According to aspects, audio device iteratively adjusts the SPL based on the ambient noise. According to aspects, the SPL is adjusted to be greater than the ambient noise by a threshold SPL amount. According to aspects, the audio device outputs sound in substantially a first direction and the microphone detects sound substantially outside of the first direction. The adjusted sounds are output by the audio device.

14 Claims, 4 Drawing Sheets

(58) Field of Classification Search
CPC .. H03G 5/00; H04R 2430/01; H04R 2460/09; H04R 3/00; H04R 1/10
See application file for complete search history.

(56) References Cited

U.S. PATENT DOCUMENTS

2012/0076311 A1* 3/2012 Isabelle ............... G10L 21/0208
381/57
2015/0263688 A1* 9/2015 Nicolino, Jr. ............ H03G 3/32
381/57

* cited by examiner

AMBIENT VOLUME CONTROL IN OPEN AUDIO DEVICE

CROSS-REFERENCE TO RELATED APPLICATIONS

This application is a continuation of co-pending U.S. patent application Ser. No. 17/654,856, titled "AMBIENT VOLUME CONTROL IN AN OPEN AUDIO DEVICE" filed Mar. 15, 2022, which is a continuation of co-pending U.S. patent application Ser. No. 16/179,592, titled "AMBIENT VOLUME CONTROL IN OPEN AUDIO DEVICE," filed Nov. 2, 2018, now U.S. Pat. No. 11,295,718. The aforementioned patent applications are herein incorporated by reference in their entirety.

FIELD

Aspects of the disclosure generally relate to controlling the sound pressure level (SPL) output by an audio device based on the ambient noise without input by a user.

BACKGROUND

Headsets deliver sound to the ear. Certain headsets include earbuds placed into an ear canal opening. The earbuds may create a gentle seal between the earbud and the user's ear canal. Certain headsets cover an outer portion of the user's ears and may create a gentle seal between the headsets and an external surface of the user's body. Earbuds and over-the-hear headsets may inhibit a user from hearing sounds in the user's surroundings and may send a social cue that the user is unavailable for interaction with others. Audio devices that allow a user to more easily hear noise in the user's vicinity and provide an indication the user is available for interaction are desirable.

SUMMARY

All examples and features mentioned herein can be combined in any technically possible manner.

Aspects provide methods and apparatus for automatically controlling, by an audio device, a sound pressure level of the audio output based on ambient noise. According to aspects, the audio device is an open audio device.

Certain aspects provide a method performed by a wearable audio device. The method includes outputting an audio signal, detecting ambient noise, comparing a sound pressure level of the audio signal with a sound pressure level of the ambient noise, automatically adjusting the sound pressure level of the audio signal based, at least in part, on the comparison to generate an adjusted audio signal, and outputting the adjusted audio signal.

In an aspect, the method further comprises after outputting the adjusted audio signal, re-detecting the ambient noise, comparing a sound pressure level of the adjusted audio signal and a sound pressure level of the re-detected ambient noise, further automatically adjusting the sound pressure level of the adjusted audio signal based, at least in part, on the comparison of the sound pressure level of the adjusted audio signal and the sound pressure level of the re-detected ambient noise to generate a further adjusted audio signal, and outputting the further adjusted audio signal.

In an aspect, adjusting the sound pressure level of the audio signal based, at least in part, on the comparison to generate the adjusted audio signal comprises adjusting the sound pressure level of the audio signal to be greater than the sound pressure level of the detected ambient noise by at least a sound pressure threshold amount. In an aspect, adjusting the sound pressure level of the audio signal to be greater than the sound pressure level of the detected ambient noise by the sound pressure threshold amount comprises boosting sound pressure level more for lower frequencies of the audio signal as compared to higher frequencies of the audio signal.

In an aspect, comparing the sound pressure level of the audio signal with the sound pressure level of the ambient noise comprises determining the absolute value of the difference between the sound pressure level of the audio signal and the sound pressure level of the detected ambient noise is greater than a first sound pressure threshold amount, and responsive to the determination, adjusting the sound pressure level of the audio signal. In an aspect, adjusting the sound pressure level of the audio signal comprises adjusting the sound pressure level of the audio signal until the sound pressure level of the adjusted audio signal exceeds the sound pressure level of the detected ambient noise by more than a second sound pressure threshold amount, wherein the first and second sound pressure threshold amounts are different.

In an aspect, a microphone on the wearable audio device is configured to detect the ambient noise, and the microphone is further configured for detecting speech of a user wearing the wearable audio device. In an aspect, the microphone is located in an acoustic null of a speaker configured to output the adjusted audio signal.

In an aspect, the wearable audio device comprises an off-ear headphone or audio eyeglasses.

Certain aspects provide a wearable audio device comprising a speaker, microphone, and processor or controller. The speaker is configured to output an audio signal, the microphone configured to detect ambient noise, and the processor configured to automatically adjust a sound pressure level of the audio signal based, at least in part, on the detected ambient noise to generate an adjusted audio signal, wherein the difference between a sound pressure level of the adjusted audio signal and a sound pressure level of the ambient noise is greater than or equal to a threshold sound pressure amount. The speaker is further configured to output the adjusted audio signal.

In an aspect, the microphone is further configured for detecting speech of a user wearing the wearable audio device.

In an aspect, the wearable audio device comprises audio eyeglasses, and the microphone is housed in a frame configured to rest on a user.

In aspect, the microphone is housed proximate a temple region above a user's ear.

In an aspect, the microphone is located in an acoustic null of the speaker, such that the microphone substantially only detects the ambient noise and substantially does not detect the audio signal and the adjusted audio signal. In an aspect, the speaker outputs the audio signal and the adjusted audio signal in a first direction, and the microphone is oriented to detect sound substantially outside of the first direction.

Certain aspects provide a method for controlling leakage by an open audio device. The method comprises outputting an audio signal, detecting ambient noise, determining the absolute value of the difference between a sound pressure level of the audio signal and a sound pressure level of the detected ambient noise is greater than a first sound pressure threshold amount, and responsive to the determination, automatically increasing or decreasing the sound pressure level of the audio signal to generate an adjusted audio signal, wherein a sound pressure level of the adjusted audio signal exceeds the sound pressure level of the detected ambient noise by more than a second sound pressure threshold amount, and outputting the adjusted audio signal.

In an aspect, the first and second sound pressure threshold amounts are different.

In an aspect, after outputting the adjusted audio signal, the method comprises re-detecting the ambient noise, comparing the sound pressure level of the adjusted audio signal and a sound pressure level of the re-detected ambient noise, further adjusting a sound pressure level of the adjusted audio signal based, at least in part, on the comparison of the sound pressure level of the adjusted audio signal and the sound pressure level of the re-detected ambient noise to generate a further adjusted audio signal, and outputting the further adjusted audio signal.

In an aspect, increasing or decreasing the sound pressure level of the audio signal to generate the adjusted audio signal comprises adjusting sound pressure level more for lower frequencies of the audio signal as compared to higher frequencies of the audio signal.

DETAILED DESCRIPTION

Open audio devices refer to audio devices that are not configured to physically obstruct a path between a user's ear canal and the outside world. Wearable open audio devices, also known as off-ear headphones, refer to wearable audio devices configured to be worn on or abutting an ear of a user, on a user's head, over the shoulders of the user, or otherwise on the user's body.

In-car earbuds and over-the-ear headphones perform passive noise reduction by at least partially blocking or obstructing a path between the user's ear canal and the outside world. In contrast to earbuds or over-the-ear headphones, wearable open audio devices are not configured to perform this type of passive noise reduction as they do not block or obstruct the user's ear canal. This configuration allows a user to hear both sounds from the user's vicinity in addition to the audio output from the audio device. In some examples, the speaker outputting the sound may be positioned very close to or against the user's skin; however, leakage escaping into the environment may distract others. As the level of ambient noise changes, a user may manually adjust the volume to comfortably hear audio output from the device. Aspects of the present disclosure provide methods and apparatus to automatically adjust a sound pressure level of an audio device based on the ambient noise in an effort to minimize leakage and provide a seamless listening experience as the level of ambient noise changes.

Figure 1:
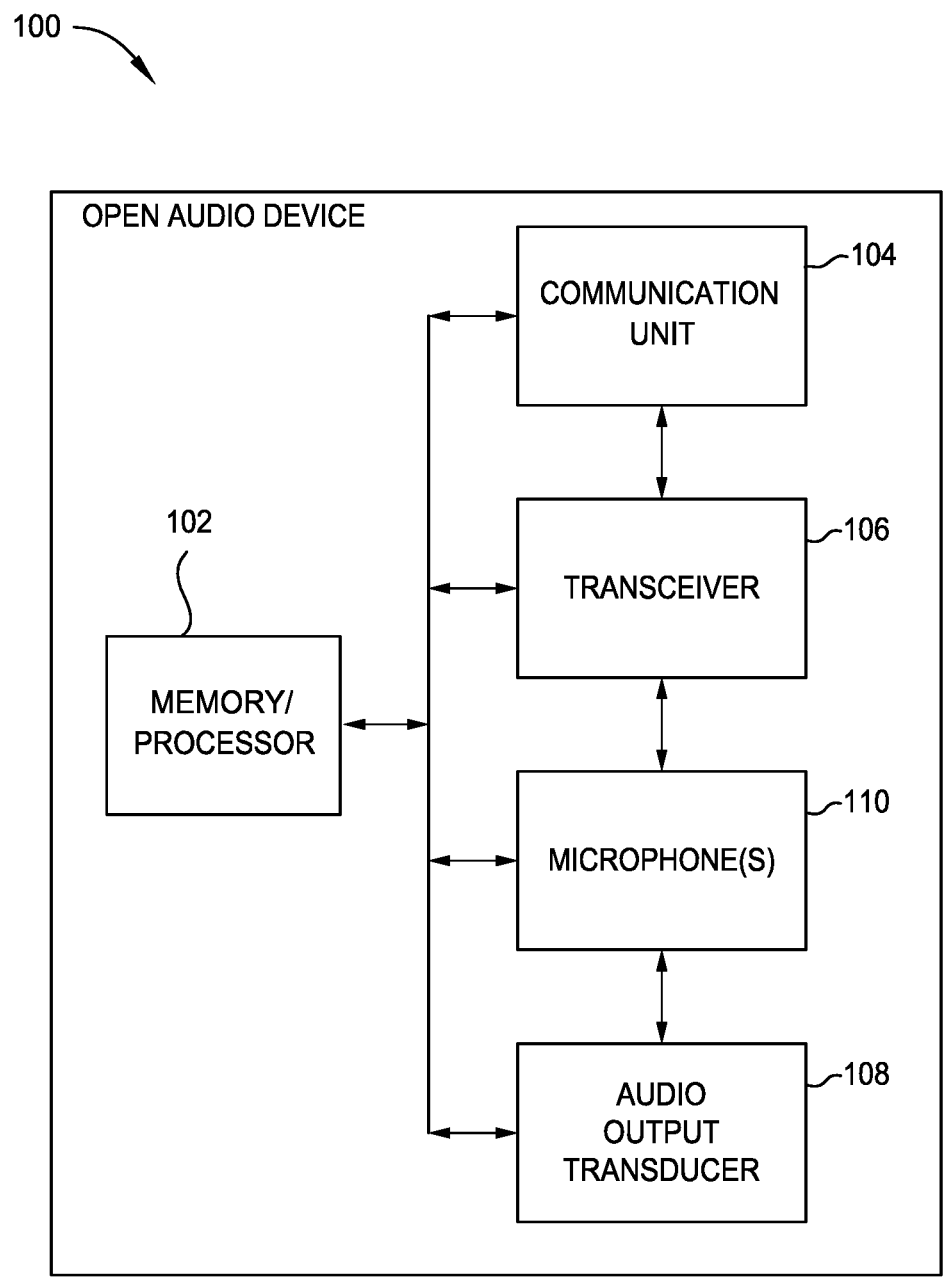
FIG. 1 illustrates an example of an open audio device, in accordance with certain aspects of the present disclosure.

FIG. 1 illustrates example components of an open audio device, in accordance with certain aspects of the present disclosure. According to an example, the audio device 100 is a wireless wearable open audio device. The audio device includes a memory and processor 102, communication unit 104, transceiver 106, and audio output transducer or speaker 108. The memory may include Read Only Memory (ROM), a Random Access Memory (RAM), and/or a flash ROM. The memory stores program code for controlling the memory and processor 102. The memory and processor 102 control the operations of the wireless device 100. Any or all of the components in FIG. 1 may be combined into multi-function components.

The processor 102 controls the general operation of the wireless device 100. For example, the processor 102 performs process and control for audio and/or data communication. In addition to the general operation, the processor 102 is configured to automatically control the volume or SPL output by the audio device 100 based on the ambient noise as described herein. By adjusting the volume based on the ambient noise, the audio output by the audio device decreases or minimizes leakage that can be heard by others. Additionally, the automatic SPL adjustment provides a desirable listening experience for the user because the SPL of the audio output is automatically adjusted to be greater than the SPL of the detected ambient noise by at least a threshold amount. Accordingly, absent user interaction, the user may comfortably hear the audio output as a level of ambient noise changes.

The communication unit 104 facilitates a wireless connection with one or more other wireless devices. For example, the communication unit 104 may include one or more wireless protocol engines such as a Bluetooth engine. While Bluetooth is used as an example protocol, other communication protocols may also be used. Some examples include Bluetooth Low Energy (BLE), Near Field Communications (NFC), IEEE 802.11, or other local area network (LAN) or personal area network (PAN) protocols.

The transceiver 106 transmits and receives information via one or more antennae to exchange information with one or more other wireless devices. According to aspects, one or more microphones 110 are configured to detect the ambient noise in the vicinity of the audio device, detect speech of a user wearing or proximate to the audio device, and convert the detected noise and/or speech into electrical signals. The transceiver 106 is not necessarily a distinct component.

The audio output transducer 108 may be also known as a driver or speaker. In some examples, more than one output transducer is used. The transducer converts electrical signals into sound and converts sound into electrical signals. The transducer is configured to output the audio signals having an automatically adjusted SPL.

FIG. 1 illustrates communication between certain modules of an example open audio device; however, aspects of the disclosure are not limited to the specific illustrated example. According to aspects, any module 102-110 is configured to communicate with any other module in the open audio device. In one example, all modules are connected to and communicate with each other.

Figure 2A:
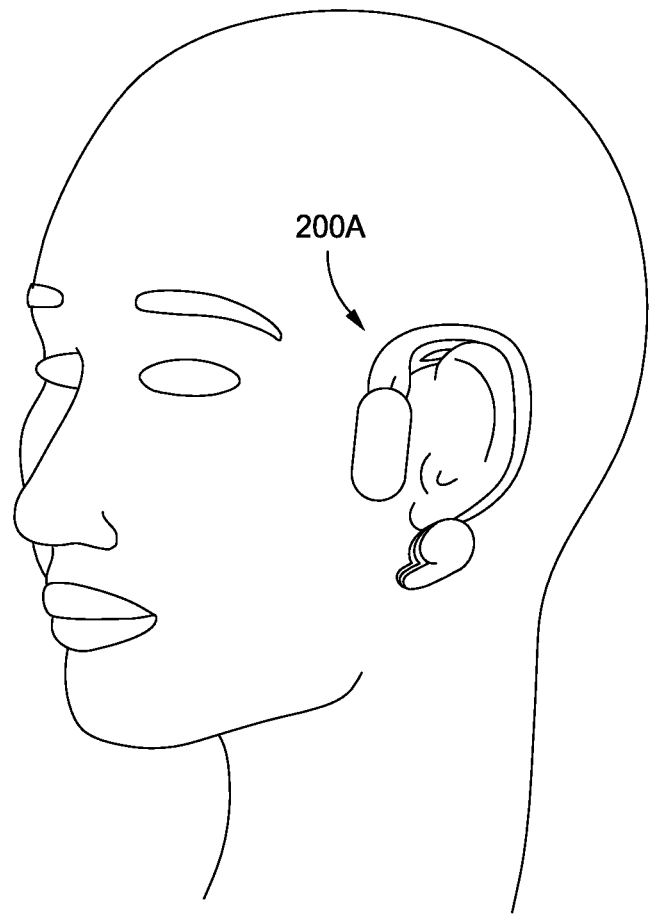
FIGS. 2A-2B illustrate examples of a wearable open audio device, in accordance with certain aspects of the present disclosure.
Figure 2B:
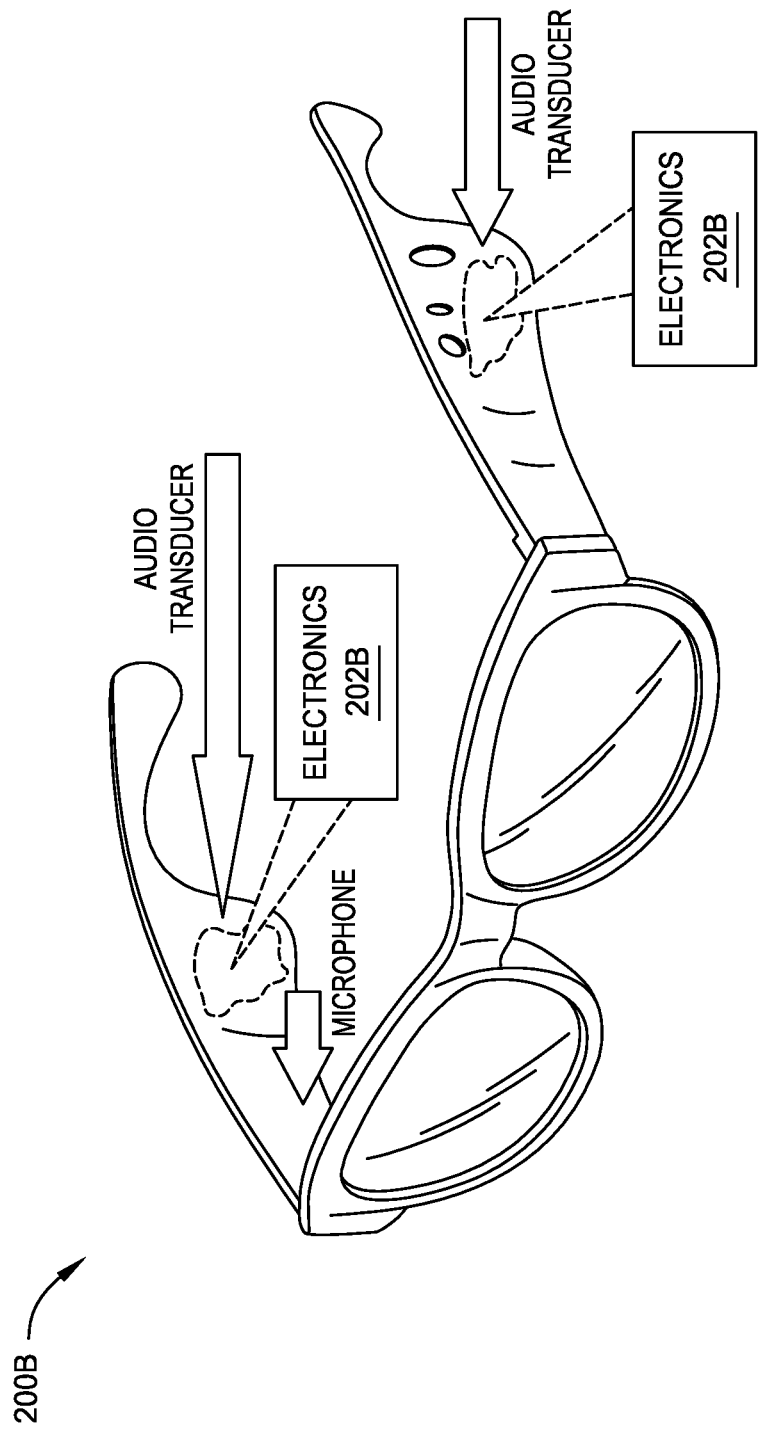

FIGS. 2A and 2B illustrate example form factors of a wearable open audio device, in accordance with aspects of the present disclosure. In FIG. 2A, an around-the-ear hook holds an audio transducer near an ear of a wearer, while in FIG. 2B an audio transducer is included in an eyeglass form factor. The example form factors in FIGS. 2A and 2B are non-limiting; other form factors of a wearable open audio device are contemplated, including head, shoulder, or body-worn acoustic devices that include one or more acoustic drivers to produce sound without physically obstruct a path between a user's ear canal and the outside world. The wearable audio device of FIGS. 2A and 2B include the one or more of the components illustrated in FIG. 1. Both of the audio devices in FIGS. 2A and 2B are configured to stay in place as the user moves his head. In FIG. 2A, the wearable audio device 200A is formed, in part, of a compliant material such that the audio device lightly clamps on the user's ear. In FIG. 2B, the wearable audio device 200B includes electronics 202B (such as those illustrated in FIG. 1) contained at least partially within the frame of the audio eyeglasses 200B. In an example, the one or more speakers and microphones are located in or around the area 202B, proximate the temple region and above an ear of a user.

In some example, the microphone is placed so that it is in an acoustic null of the speaker output, which enhances acoustic isolation of the speaker output from the microphone. This helps to ensure the microphone is measuring the sounds of the ambient environment and not the audio output by the audio device. Accordingly, the microphone is able to determine the amount of ambient noise without an echo canceller while the speakers are outputting audio.

According to an example, one or more microphones are disposed proximate a temple region, on the bridge, and/or on the frame proximate the bottom of the lens of the audio eyeglasses 200B. According to an example, the frames of the acoustic audio eyeglasses 200B include a number of sound-emitting openings. The housing and its openings are constructed and arranged to achieve a desired delivery of audio to a particular location, for example, close to the user's ear. This helps to minimize leakage to the outside environment. A first front opening and a second rear opening radiate sound from a speaker to the environment outside the frames of the audio eyeglasses 202B in a manner that may be similar to an acoustic dipole. The audio eyeglasses 200B exhibit acoustic characteristics of an approximate dipole, where the effective dipole length is not fixed. Example configurations of audio devices configured with a variable dipole are described in U.S. Patent Publication No. 2018-0167710, entitled "Acoustic Transducer" filed on Dec. 11, 2016 and U.S. patent application Ser. No. 15/884,924, entitled "Eyeglass Headphones" filed on Jan. 31, 2018, which are incorporated by reference in their entirety.

Examples of wearable audio devices are described in U.S. patent application Ser. No. 15/901,076, entitled "Audio Device" filed on Feb. 21, 2018 and U.S. patent application Ser. No. 16/050,682, entitled "Audio Eyeglasses With Cable-Through Hinge And Related Flexible Printed Circuit" filed on Jul. 31, 2018, which are incorporated by referenced in their entirety.

Figure 3:
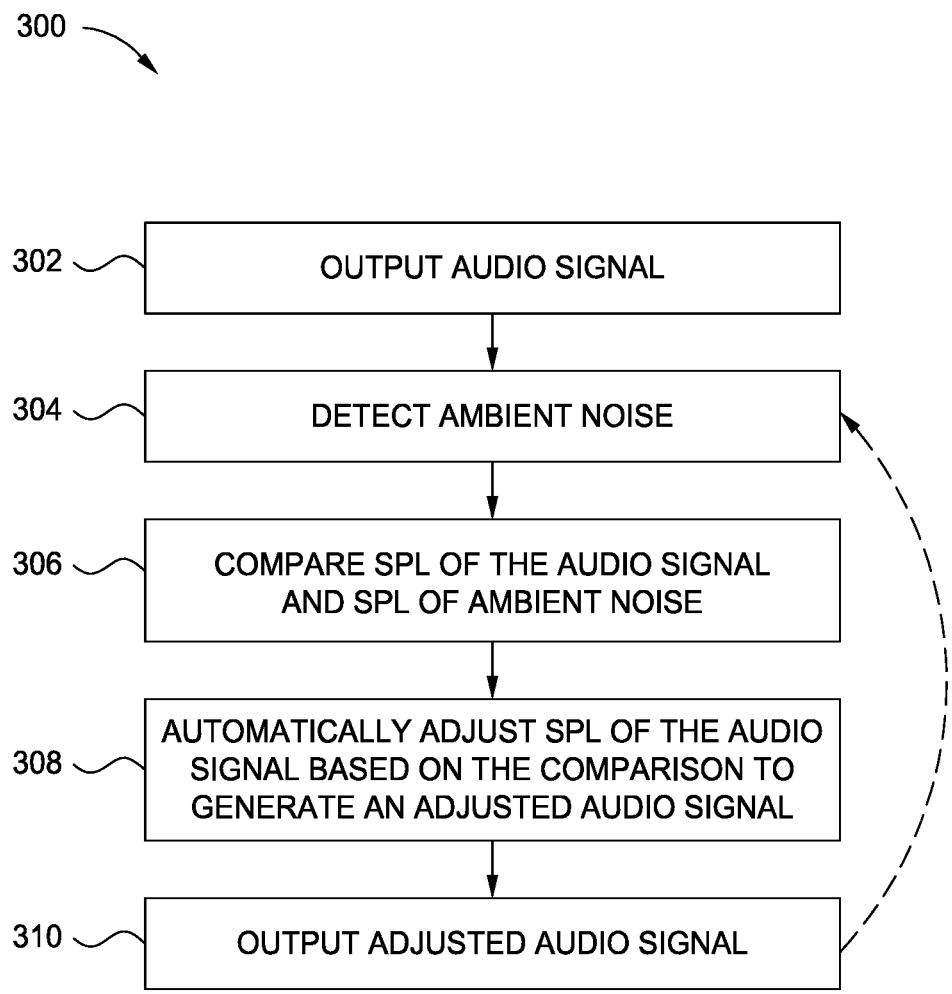
FIG. 3 illustrates example operations performed by a wearable audio device, in accordance with certain aspects of the present disclosure.

FIG. 3 illustrates example operations 300 for controlling an SPL output of an audio device based on the ambient noise in accordance with aspects of the present disclosure. The audio device is an open audio device. While examples are described with reference to wearable open audio devices, the techniques described herein may be performed by any type of open audio device, such as, for example, non-wearable speakers.

At 302, the audio device outputs an audio signal via one or more speakers. At 304, the audio device detects ambient noise. In an example, a microphone in the audio device detects the ambient noise. At 306, the audio device compares an SPL of the audio signal with an SPL of the ambient noise. The ambient noise detected by the audio device changes by one or more of the audio device moving or varying ambient noise.

In an effort to adaptively adjust the audio output while minimizing leakage to others nearby the audio device, at 308, the audio device automatically adjusts the SPL of the audio signal based, at least in part, on the comparison of the audio signal with the SPL of the ambient noise to generate an adjusted audio signal. In louder environments, a user of the audio device needs the audio output by the audio device to be louder and people in the vicinity of the audio device are less sensitive to leakage. When the ambient noise changes, for example to a quieter environment having a lower SPL, the user may not need the audio output to be as loud and people in the vicinity of the audio device in are more sensitive to leakage.

According to aspects, the audio device is configured with a first SPL threshold amount. When the absolute value of the difference between the SPL of the audio signal and the SPL of the ambient noise is greater than the first SPL threshold amount, the audio device is configured to, at 308, automatically adjust the SPL of the audio signal.

According to aspects, the audio device is configured with a second SPL threshold amount. After the first SPL threshold is reached, the audio device is configured to adjust the SPL of the audio signal until the SPL of the adjusted audio signal exceeds the SPL of the detected ambient noise by the second SPL threshold amount. In some examples, the first SPL threshold amount is greater than the second SPL threshold amount, though in other examples the first SPL threshold amount and the second SPL threshold amount may be the same. Thus, the audio device is configured to trigger automatically adjusting the SPL of the audio output when the absolute value of the difference between the SPL of the audio signal and the SPL of the ambient noise is within a first delta SPL amount, and the audio device adjusts the SPL of the audio output until the SPL of the audio output is greater than the SPL of the ambient environment by a second delta amount.

In an example, a user of a wearable audio device moves from a quieter environment, such as the user's home, to a louder environment, such as a busy street. Instead of manually increasing the volume to comfortably hear the audio output as the user walks outside along the busy street, the audio device determines the SPL difference between the ambient noise and the audio output is greater than the first SPL threshold amount. In response, the audio device boosts the volume of the audio output until the SPL of the adjusted audio output is greater than the ambient noise by a second SPL threshold amount.

According to an example, a different boost in SPL is applied to different frequency bands. In an example, the boost is applied to bass, mid-range, and/or treble frequency bands. In an example, bass frequency bands refer to lower frequencies that are below 100 Hz, mid-range frequency bands refer to frequencies between 100 Hz and 4 kHz, and treble frequency bands refer to higher frequencies above 4 kHz.

According to aspects, the SPL boost applied to lower bass band frequencies is greater than the SPL boost applied to mid-range frequencies and the SPL boost applied to mid-range frequencies is greater than the SPL boost applied to treble frequencies.

Continuing with the example, the user walks into a quiet office space from the busy street. Instead of manually decreasing the volume to comfortably hear the audio and minimize disruption to others, the audio device determines the SPL of the ambient environment is greater than the SPL of the audio output by more than the first SPL threshold amount. In response, the audio device decreases the SPL of the audio output until the SPL of the adjusted audio output is greater than the SPL ambient environment by the second SPL threshold amount. According to aspects, a different adjustment in SPL is applied to different frequency bands. In an example, the SPL adjustment is applied to bass, mid-range, and/or treble frequency bands. According to aspects, a larger decrease in SPL is applied to lower bass band frequencies as compared to mid-range frequencies and a larger decrease in SPL is applied to mid-range frequencies as compared to treble frequencies. In an example, a smaller decrease in SPL is applied to higher frequencies of the audio signal.

Table 1 provides example SPL boost values in dB applied to music audio based on the frequency range. The music has a constant SPL of 70 dB estimated at the user's ear. The ambient noise increases from 50 dB to 65 dB in increments of 5 dB. Because there is no or substantially no feedback path, the SPL boost applied per frequency range does not result in an increase (or substantial increase) in estimated music SPL at the user's ear.

The increase in or decrease in SPL is independently controlled for each frequency range. As shown in Table 1, the SPL of the bass band frequencies are boosted more than the SPL of the mid-range frequencies, and the SPL of the mid-rage frequencies are boosted more than the SPL of the treble frequencies. Correspondingly, when the ambient noise decreases, for example, from 65 dB to 50 dB, the SPL of the bass band frequencies are decreased more than the SPL of the mid-range frequencies, and the SPL of the mid-range frequencies are decreased more than the SPL of the treble frequencies.

TABLE 1

| | | | | |
|---|---|---|---|---|
| MusicSPL in dB | 70 | 70 | 70 | 70 |
| NoiseSPL in dB | 50 | 55 | 60 | 65 |
| Bass Boost in dB | 0 | 0.7 | 7.7 | 14.7 |
| Mid-Range Boost in dB | 0 | 0 | 4.4 | 9.9 |
| Treble Boost in dB | 0 | 0 | 2.7 | 7.2 |

At 310, the audio device outputs the adjusted audio signal. As described above, the adjusted audio signal may have an SPL that is greater than or less than the SPL of the audio signal output at 302.

As described above, the sound pressure of the audio signal is continuously adjusted to be greater than the SPL of the ambient noise by at least the second SPL threshold amount. According to aspects, after 310, the method continues to 304 to re-detect the ambient noise. At 306, the audio device compares the SPL of the adjusted audio signal and an SPL of the re-detected ambient noise. At 308, the audio device further automatically adjusts the SPL of the adjusted audio signal based on the comparison of the SPL of the adjusted audio signal and the SPL of the re-detected ambient noise to generate a further adjusted audio signal. At 310, the audio device outputs the further adjusted audio signal.

In certain open-car audio devices, the microphone detects ambient noise as well as the audio output of the audio device. An echo canceller may be used to cancel the audio signal output from the open-car audio device from the signals detected by the microphone. According to aspects, an echo canceller is not needed in the audio device configured to perform automatic SPL adjustment based on the ambient noise. Instead, the one or more microphones are located within the audio device so that it is positioned in an acoustic null of the speaker, such that the one or more microphones substantially do not detect the audio signal and the adjusted audio signal output by the audio device while detecting the ambient noise.

In an example, due to the location and configuration of the one or more microphones and speakers, the audio signals are output by the speakers in substantially a first direction and the microphone detects signals outside of the first direction. By substantially not detecting audio signals output by the speakers, the microphones primarily detect only the ambient noise. Accordingly, the audio device may not need to perform resource-intensive calculations using, for example, an echo canceller, to cancel the output of the audio device from the signal detected by the microphone. An example speaker that outputs sound substantially in a first direction is described in U.S. Patent Publication No. 2018-0167710, entitled "Acoustic Transducer" filed on Dec. 11, 2016 and U.S. patent application Ser. No. 15/884,924, entitled "Eyeglass Headphones" filed on Jan. 31, 2018, which are incorporated by reference in their entirety.

Absent the techniques described herein, a user would need to adjust the volume of the audio output based on changes in the ambient environment, and/or a device would require a resource-intensive echo canceller to enable the microphone to accurately detect the ambient noise level. The automatic SPL adjustment provides a comfortable, more-seamless listening experience despite changes in the user's ambient environment. Thus, a user may listen to audio output that is automatically adjusted to accommodate the user's setting. Further, the user may not recognize any changes in the SPL of the audio signal output by the audio device. In addition, the position of the one or more microphones and the configuration of the speaker permit more accurate and efficient automatic SPL adjustment, requiring a lower overall use of processing resources and therefore improving the battery life of the audio device.

In the preceding, reference is made to aspects presented in this disclosure. However, the scope of the present disclosure is not limited to specific described aspects. Aspects of the present disclosure may take the form of an entirely hardware embodiment, an entirely software embodiment (including firmware, resident software, micro-code, etc.) or an embodiment combining software and hardware aspects that may all generally be referred to herein as a "component," "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples a computer readable storage medium include: an electrical connection having one or more wires, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the current context, a computer readable storage medium may be any tangible medium that can contain, or store a program.

The flowchart and block diagrams in the Figures illustrate the architecture, functionality and operation of possible implementations of systems, methods and computer program products according to various aspects. In this regard, each block in the flowchart or block diagrams may represent a module, segment or portion of code, which comprises one or more executable instructions for implementing the specified logical function(s). In some implementations the functions noted in the block may occur out of the order noted in the figures. For example, two blocks shown in succession may, in fact, be executed substantially concurrently, or the blocks may sometimes be executed in the reverse order, depending upon the functionality involved. Each block of the block diagrams and/or flowchart illustrations, and combinations of blocks in the block diagrams and/or flowchart illustrations can be implemented by special-purpose hardware-based systems that perform the specified functions or acts, or combinations of special purpose hardware and computer instructions.

The invention claimed is:

1. A method for outputting an adjusted audio signal by a wearable audio device, the method comprising:
   outputting an audio signal;
   continuously detecting ambient noise in the vicinity of the audio device;
   determining the absolute value of the difference between a sound pressure level (SPL) of the audio signal and the SPL of the ambient noise is greater than a first SPL threshold amount;
   automatically adjusting the SPL of the audio signal by boosting SPLs for both lower frequencies and higher frequencies of the audio signal based on the detected ambient noise, wherein the SPL is boosted more for the lower frequencies of the audio signal as compared to the higher frequencies of the audio signal, the SPL boosts for both the lower frequencies and the higher frequencies of the audio signal are dependent upon the detected ambient noise, and wherein the dependency varies among the lower frequencies and the higher frequencies; and
   outputting the adjusted audio signal.

2. The method of claim 1, wherein the automatically adjusting further comprises automatically adjusting the SPL of the audio signal until it exceeds the SPL of the detected ambient noise by a second SPL threshold amount.

3. The method of claim 2, wherein the first and second threshold amounts are different.

4. The method of claim 1, wherein the automatically adjusting comprises adjusting any combination of bass, mid-range, or treble frequency bands of the audio signal.

5. The method of claim 2, wherein a boost applied to bass band frequency bands of the audio signal is greater than the SPL boost applied to mid-range frequency bands of the audio signal, and the SPL boost applied to mid-range frequency bands of the audio signal is greater than a boost applied to treble frequency bands of the audio signal.

6. The method of claim 1, wherein the continuously detecting is performed by at least one microphone of the audio device positioned in an acoustic null of a speaker.

7. The method of claim 6, wherein outputting the audio signal comprises outputting audio signals in a substantially first direction and the microphone detects signals outside of the first direction.

8. A wearable audio device comprising:
   a speaker configured to output an audio signal;
   a microphone configured to continuously detect ambient noise in the vicinity of the audio device; and
   a processor configured to:
      determine the absolute value of the difference between a sound pressure level (SPL) of the audio signal and the SPL of the ambient noise is greater than a first SPL threshold amount;
      automatically adjust the SPL of the audio signal by boosting SPLs for both lower frequencies and higher frequencies of the audio signal based on the detected ambient noise, wherein the SPL is boosted more for the lower frequencies of the audio signal as compared to the higher frequencies of the audio signal, the SPL boosts for both the lower frequencies and the higher frequencies of the audio signal are dependent upon the detected ambient noise, and wherein the dependency varies among the lower frequencies and the higher frequencies,
   wherein the speaker is further configured to output the adjusted audio signal.

9. The wearable audio device of claim 8, wherein the processor is configured to automatically adjust by automatically adjusting the SPL of the audio signal until it exceeds the SPL of the detected ambient noise by a second SPL threshold amount.

10. The wearable audio device of claim 9, wherein the first and second threshold amounts are different.

11. The wearable audio device of claim 8, wherein the processor is configured to automatically adjust by automatically adjusting any combination of bass, mid-range, or treble frequency bands of the audio signal.

12. The wearable audio device of claim 9, wherein the processor is configured to adjust by boosting and the boost applied to bass band frequency bands of the audio signal is greater than the SPL boost applied to mid-range frequency bands of the audio signal, and the SPL boost applied to mid-range frequency bands of the audio signal is greater than a boost applied to treble frequency bands of the audio signal.

13. The wearable audio device of claim 8, wherein the microphone is positioned in an acoustic null of a speaker.

14. The wearable audio device of claim 13, wherein the speaker configured to output the audio signals comprises outputting audio signals in a substantially first direction and the microphone detects signals outside of the first direction.

* * * * *